United States Patent
Hu et al.

(10) Patent No.: US 10,593,697 B1
(45) Date of Patent: Mar. 17, 2020

(54) MEMORY DEVICE

(71) Applicant: MACRONIX INTERNATIONAL CO., LTD., Hsinchu (TW)

(72) Inventors: Chih-Wei Hu, Miaoli (TW); Teng-Hao Yeh, Zhubei (TW); Yu-Wei Jiang, Hsinchu (TW); Kuo-Pin Chang, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/540,275

(22) Filed: Aug. 14, 2019

(51) Int. Cl.
*H01L 27/11582* (2017.01)
*H01L 27/1157* (2017.01)

(52) U.S. Cl.
CPC .... *H01L 27/11582* (2013.01); *H01L 27/1157* (2013.01)

(58) Field of Classification Search
CPC .................. H01L 27/11582; H01L 27/1157
USPC ......................................... 257/324
See application file for complete search history.

(56) References Cited

U.S. PATENT DOCUMENTS

2010/0155810 A1* 6/2010 Kim .................. H01L 27/11548
257/316

* cited by examiner

*Primary Examiner* — Elias Ullah
(74) *Attorney, Agent, or Firm* — McClure, Qualey & Rodack, LLP

(57) ABSTRACT

A memory device includes a channel element, a gate electrode layer and a memory element. The channel element has a U shape. The gate electrode layer is electrically coupled to the channel element. The memory element surrounds a sidewall channel surface of the channel element.

20 Claims, 19 Drawing Sheets

MEMORY DEVICE

BACKGROUND

Technical Field

The disclosure relates to a memory device, and particularly to a NAND memory device.

Description of the Related Art

As critical dimensions of devices in integrated circuits shrink toward perceived limits of manufacturing technologies, designers have been looking to techniques to achieve greater storage capacity, and to achieve lower costs per bit. Technologies being pursued include a NAND memory and an operation performed therefor.

SUMMARY

The present disclosure relates to a memory device.

According to an embodiment, a memory device is provided. The memory device comprises a channel element, a gate electrode layer and a memory element. The channel element has a U shape. The gate electrode layer is electrically coupled to the channel element. The memory element surrounds a sidewall channel surface of the channel element.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Figure 1:
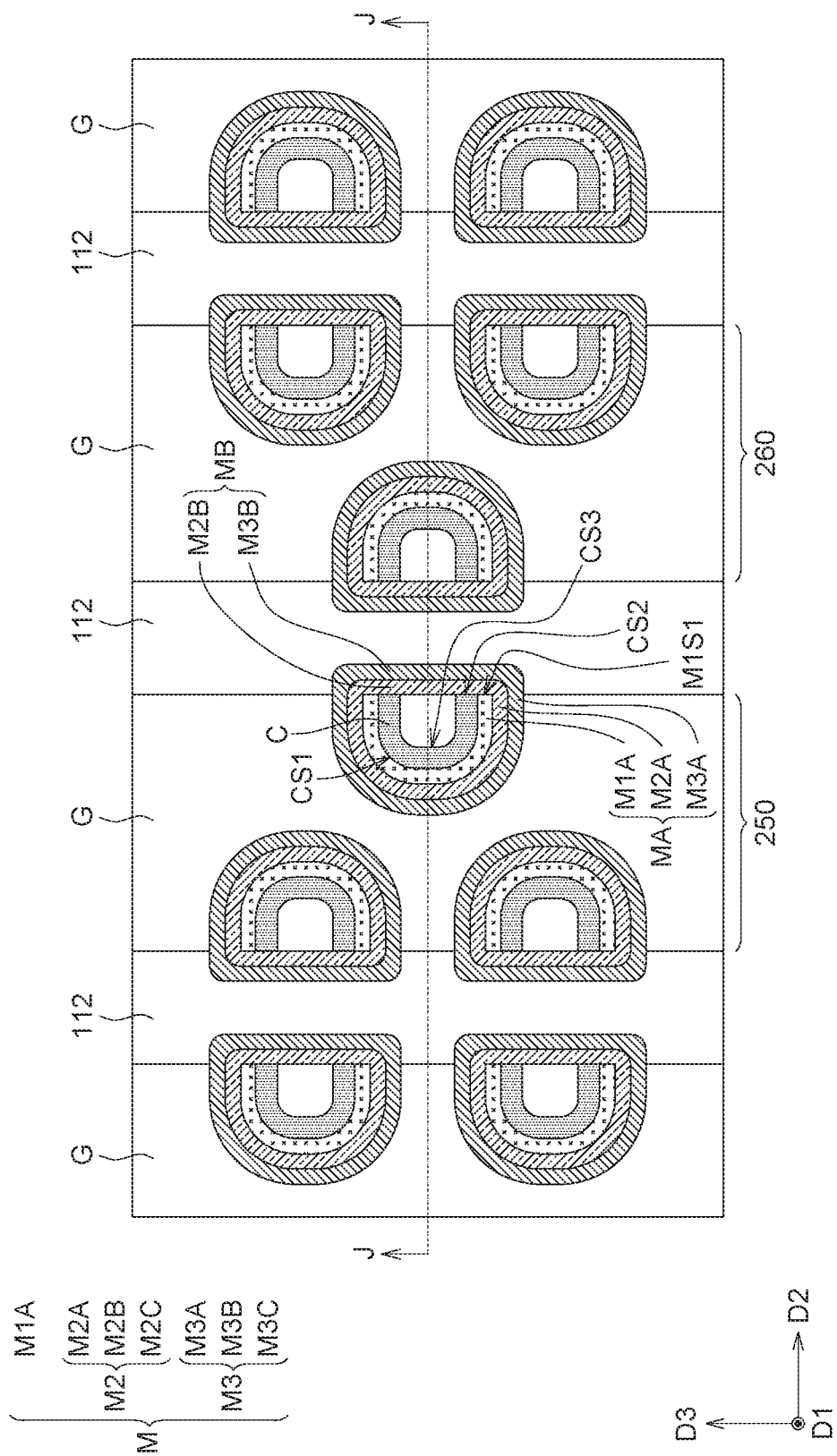
FIG. 1 illustrates a lateral cross-section view of a memory device according to an embodiment.
Figure 2:
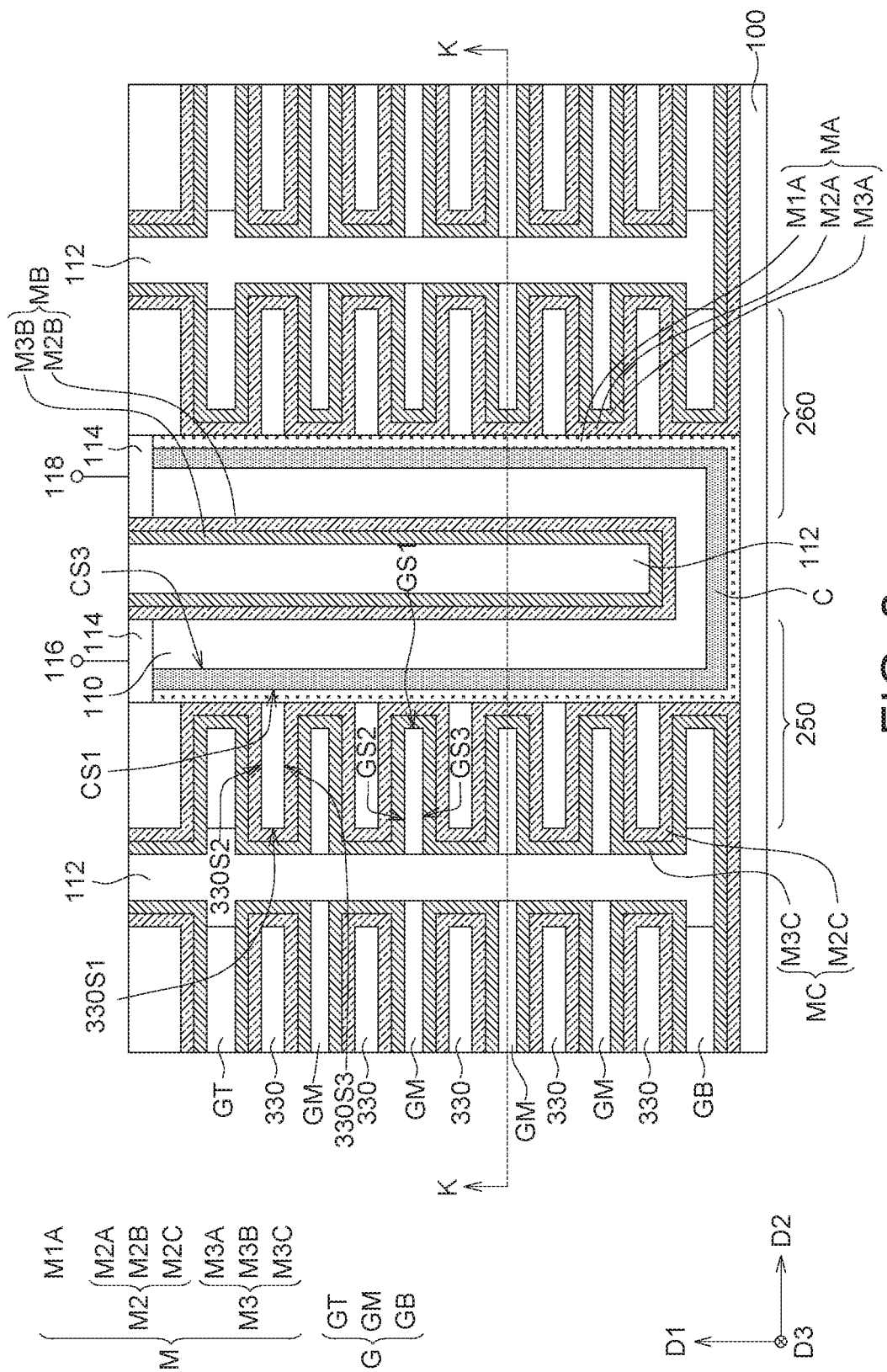
FIG. 2 illustrates a longitudinal cross-section view of a memory device according to an embodiment.

FIG. 1 illustrates a lateral cross-section view of a memory device according to an embodiment. FIG. 2 illustrates a longitudinal cross-section view of the memory device according to an embodiment. In an embodiment, FIG. 1 may be a cross-section view drawn along a KK cross-section line of FIG. 2, and FIG. 2 may be a cross-section view drawn along a JJ cross-section line of FIG. 1.

Referring to FIG. 1, the memory device comprises a channel element C, a gate electrode layer G and a memory element M.

In embodiments, the channel element C has a U shape. A sidewall channel surface of the channel element C may comprise a first sidewall channel surface CS1, a second sidewall channel surface CS2 and a third sidewall channel surface CS3. The second sidewall channel surface CS2 is between the first sidewall channel surface CS1 and the third sidewall channel surface CS3. In an embodiment, the channel element C may have a horseshoe shape pattern or an open ring shape pattern arranged as having a U shape. The first sidewall channel surface CS1 (as an outer sidewall surface of the horseshoe shape pattern or the open ring shape pattern) and the third sidewall channel surface CS3 (as an inner sidewall surface of the horseshoe shape pattern or the open ring shape pattern) have a U shape. The second sidewall channel surface CS2 (as sidewall surfaces of two ends of the horseshoe shape pattern or the open ring shape pattern) may have a straightness shape. A dielectric pillar 110 may be on the third sidewall channel surface CS3.

The memory element M may comprise memory layers. In an embodiment, the memory element M comprises a first memory layer M1A, a second memory layer M2, and a third memory layer M3. The second memory layer M2 is on a sidewall surface of the first memory layer M1A. The third memory layer M3 is on a sidewall surface of the second memory layer M2.

The memory element M comprises a first memory portion MA and a second memory portion MB. The first memory portion MA is on the first sidewall channel surface CS1. The first memory portion MA has a U shape. The second memory portion MB is on the second sidewall channel surface CS2 of the channel element C. The second memory portion MB may be on the coplanar sidewall surface of the first memory layer M1A and the channel element C. The second memory portion MB has a straightness shape. The first memory portion MA and the second memory portion MB form a ring shape surrounding the sidewall channel surface of the channel element C and a sidewall surface of the dielectric pillar 110.

A memory layer amount of the first memory portion MA may be different from a memory layer amount of the second memory portion MB. In the embodiment, the memory layer amount of the first memory portion MA is more than the memory layer amount of the second memory portion MB. The first memory portion MA may comprise the first memory layer MIA, the second memory layer M2A and the third memory layer M3A. In other words, the memory layer amount of the first memory portion MA is three. The second memory portion MB may comprise the second memory layer M2B and the third memory layer M3B. In other words, the memory layer amount of the second memory portion MB is two. The first memory layer may be not included by the second memory portion MB. The first memory layer M1A, the second memory layer M2A and the third memory layer M3B of the first memory portion MA have a U shape. The sidewall surface M1S1 of the first memory layer MIA may be coplanar with the second sidewall channel surface CS2 of the channel element C. The second memory layer M2B and the third memory layer M3B of the second memory portion MB have a straightness shape.

The first memory portion MA may comprise any kind of charge trapping structure, such as an ONO structure, or BE-SONOS structure, etc. For example, a charge trapping layer may use a nitride such as silicon nitride, or other high-K materials comprising a metal oxide such as $Al_2O_3$, HfO$_2$, and so on. The first memory layer M1A comprises a tunnel layer. The second memory layer M2 (comprising the second memory layer M2A and the second memory layer M2B) comprises the charge trapping layer. The third memory layer M3 (comprising the third memory layer M3A and the third memory layer M3B) comprises blocking layer. In an embodiment, the tunnel layer comprises an oxide such as silicon oxide. The charge trapping layer comprises a nitride such as silicon nitride. The blocking layer comprises an oxide such as silicon oxide, Al$_2$O$_3$, and so on.

The first memory portion MA and the channel element C are between the second memory portion MB and the gate electrode layer G. The second memory portion MB is between the dielectric pillar 110 and a dielectric strip 112. The dielectric pillar 110 may comprise an oxide such as silicon oxide. The present disclosure is not limited thereto.

Referring to FIG. 1 and FIG. 2, the memory device may comprise stack regions, such as a first stack region 250, a second stack region 260, etc. The dielectric strip 112 is between the gate electrode layers G in the first stack region 250 and the gate electrode layers G in the second stack region 260. Each of the first stack region 250 and the second stack region 260 comprises gate electrode layers G and dielectric layers 330. The gate electrode layers G and the dielectric layers 330 are arranged along a first direction D1 (such as a vertical direction) alternately. The gate electrode layers G are electrically coupled to the channel element C. The gate electrode layers G may comprise a gate electrode layer GT of the top layer, a gate electrode layer GB of the bottom layer, and gate electrode layers GM between the gate electrode layer GT and the gate electrode layer GB. The stack regions of the memory device (such as the first stack region 250, the second stack region 260, etc.) may be arranged along a lateral direction (such as a second direction D2).

In an embodiment, the memory element M further comprises a third memory portion MC. The first memory portion MA is connected between the second memory portion MB and the third memory portion MC. The third memory portion MC may be extended from the first memory portion MA and extended continuously to a sidewall surface 330S1, an upper surface 330S2, and a lower surface 330S3 of the dielectric layer 330, and to an upper surface GS2 and a lower surface GS3 of the gate electrode layer G.

The memory element M is between the gate electrode layers G and the dielectric layers 330. The memory element M is on a sidewall surface GS1 (sidewall electrode surface), an upper surface GS2 (upper electrode surface), and a lower surface GS3 (lower electrode surface) of the gate electrode layer G. The memory element M is on the sidewall surface 330S1 (sidewall dielectric surface), the upper surface 330S2 (upper dielectric surface), and the lower surface 330S3 (lower dielectric surface) of the dielectric layer 330. The sidewall surfaces GS1 having the memory element M thereon are opposing to the sidewall surfaces 330S1 having the memory element M thereon.

A memory layer amount of the first memory portion MA may be different from a memory layer amount of the third memory portion MC. Otherwise, the first memory portion MA and the third memory portion MC may have different memory layer arrangement. The memory layer amount of the first memory portion MA may be more than the memory layer amount of the third memory portion MC. Third memory portion MC and the second memory portion MB may have the same memory layer amount, or have the same memory layer arrangement. Memory layers of the third memory portion MC may comprise the second memory layer M2C and the third memory layer M3C. The first memory layer may be not included by the third memory portion MC.

A conductive layer 114 may be on the first memory layer M1A, the channel element C and the dielectric pillar 110. An electrode element 116 and an electrode element 118 are respectively electrically connected to the conductive layers 114 separated from each other by the dielectric strip 112 and the second memory portion MB.

The memory device comprises NAND memory strings. The NAND memory string may comprise memory cells defined in the memory element M between the channel element C and the gate electrode layers G. The NAND memory string may comprise a U shape channel NAND memory string, or a vertical channel NAND memory string.

In an embodiment, the electrode element 116 may be a bit line, and the electrode element 118 may be a common source line. The NAND memory string may comprise memory cells defined in the memory element M between the channel element C and the gate electrode layers G in the first stack region 250 and the second stack region 260. The NAND memory string has a U shape effective channel path. The U shape channel and the memory cells are electrically connected between the electrode element 116 functioned as the bit line and the electrode element 118 functioned as the common source line. The gate electrode layer GT in the first stack region 250 may be functioned as a string selection line (SSL). The gate electrode layer GT in the second stack region 260 may be functioned as a ground selection line (GSL). In an embodiment, gate electrode layer GB in the first stack region 250 and the gate electrode layer GB in the second stack region 260 may be functioned as inversion gate electrodes. In an embodiment, the gate electrode layers GM in the first stack region 250 and the gate electrode layers GM in the second stack region 260 may be functioned as word lines. In an embodiment, a portion of the gate electrode layers GM near the gate electrode layer GT in the first stack region 250 and/or the second stack region 260 may be functioned as a dummy word line (or dummy word lines) to avoid possible disturbance. For example, the top one of the gate electrode layers GM in the first stack region 250 and the top one of the gate electrode layers GM in the second stack region 260 may be functioned as dummy word lines. A substrate 100 may be an insulating layer, such as a buried oxide layer (e.g. silicon oxide) formed on a semiconductor substrate. The present disclosure is not limited thereto.

In another embodiment, the electrode element 116 may be a bit line. The substrate 100 may be electrically connected to a common source terminal or used as a common source element. The substrate 100 may comprise a semiconductor substrate such as a silicon material containing substrate, such as silicon substrate, etc. The NAND memory string may comprise memory cells defined in the memory element M between the channel element C and the gate electrode layers G in the first stack region 250. The NAND memory string has an effective vertical channel path extended along the first direction D1 (such as the vertical direction), and electrically connected between the electrode element 116 and the substrate 100. The gate electrode layer GT in the first stack region 250 may be functioned as a string selection line (SSL). The gate electrode layer GB in the first stack region 250 may be functioned as a ground selection line (GSL). In an embodiment, gate electrode layers GM in the first stack region 250 may be functioned as word lines. In an embodiment, a portion of the gate electrode layers GM in the first stack region 250 may be functioned as a dummy word line. The electrode element 118 may be functioned as a bit line, and a vertical channel NAND memory string adjacent to the second stack region 260 may be analogous thereto.

FIG. 3 to FIG. 13 illustrate a manufacturing method for the memory device according to an embodiment.

Figure 3:
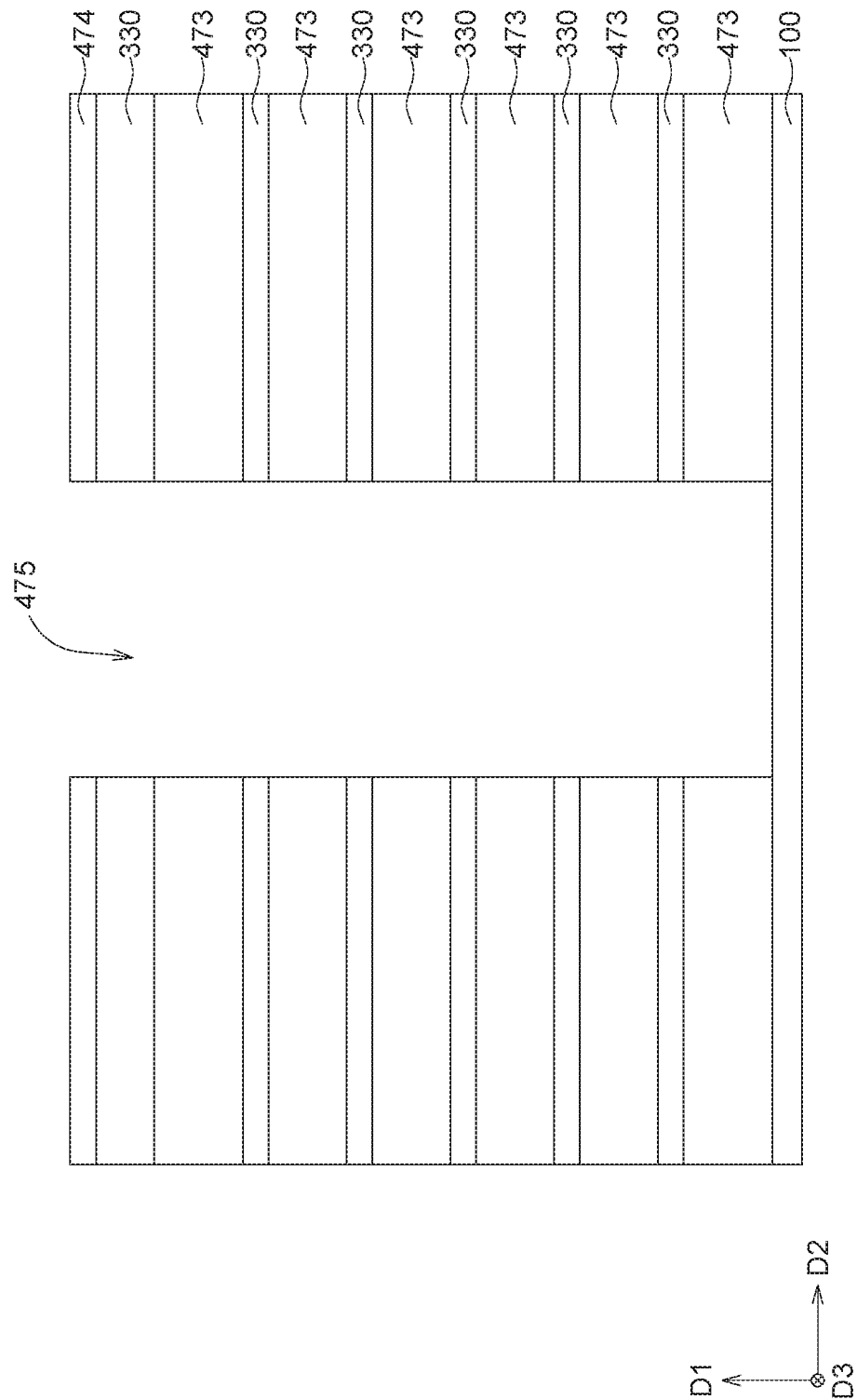
FIG. 3 to FIG. 13 illustrate a manufacturing method for a memory device according to an embodiment.

Referring to FIG. 3, the substrate 100 is provided. A stack structure may be formed on the substrate 100. The stack structure may comprise sacrificial layers and the dielectric layers 330 stacked alternately on the substrate 100. The sacrificial layers may comprise a sacrificial layer 474 and sacrificial layers 473 under the sacrificial layer 474. The sacrificial layers 473, the sacrificial layer 474, and the dielectric layers 330 may comprise different materials. In an embodiment, the sacrificial layers 473 and the sacrificial layer 474 comprise a nitride such as silicon nitride. The present disclosure is not limited thereto. The dielectric layers 330 comprise an oxide such as silicon oxide. The present disclosure is not limited thereto. The sacrificial layers 473, the sacrificial layer 474 and the dielectric layers 330 may be formed by a deposition method such as a PVD method, a CVD method, or other suitable methods. An opening 475 may be formed in the stack structure with using photolithography and etch techniques. In an embodiment, an etching step for forming the opening 475 may stop on the substrate 100. In an embodiment, the opening 475 exposes the buried oxide layer of the substrate 100.

Figure 4:
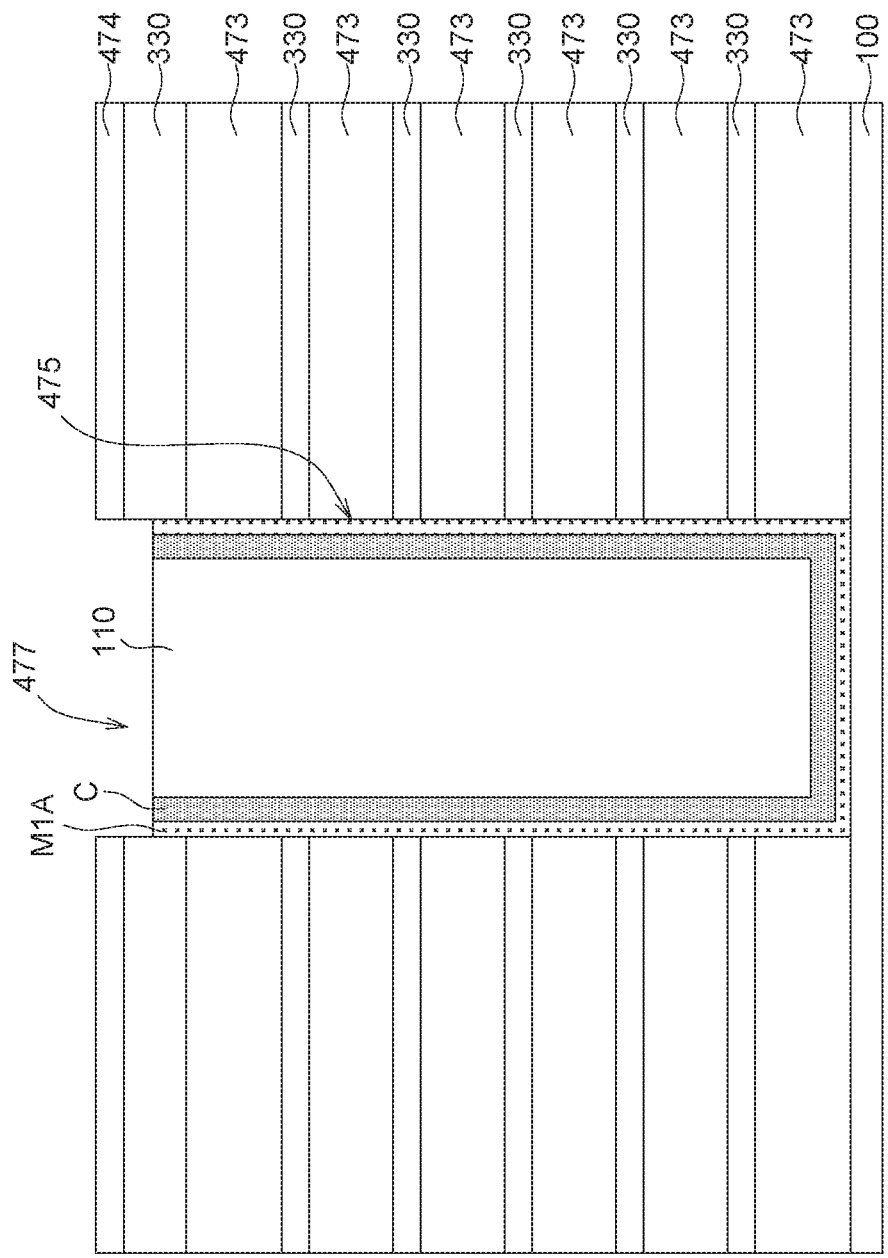

Referring to FIG. 4, the first memory layer M1A may be formed a sidewall surface of the stack structure and an upper surface of the substrate 100 exposed by the opening 475. The first memory layer MIA may be formed on an upper surface of the stack structure. The channel element C may be formed on the first memory layer MIA exposed by the opening 475. The channel element C may be formed on the first memory layer MIA on the upper surface of the stack structure. The channel element C may comprise a polysilicon or other suitable semiconductor materials. In an embodiment, the dielectric pillar 110 may be formed on the channel element C and filling the opening 475. In an embodiment, the dielectric pillar 110 may be formed by a method comprising forming a dielectric material filling the opening 475 and extending on the channel element C on the upper surface of the stack structure, and removing a portion of the dielectric material on the upper surface of the stack structure by a CMP method or other suitable etching methods to remain a portion of the dielectric material in the opening 475 to form the dielectric pillar 110. The dielectric material may comprise an oxide such as silicon oxide. The present disclosure is not limited thereto. The first memory layer M1A and the channel element C on the upper surface of the stack structure may be also removed by a CMP method or other suitable etching methods. An etching back process may be performed to the first memory layer MIA, the channel element C and the dielectric pillar 110 in the opening 475 to form a recess 477 by suitable etching methods. A depth of the recess 477 does not reach an upper surface of the sacrificial layer 473 of the top layer.

Figure 5:
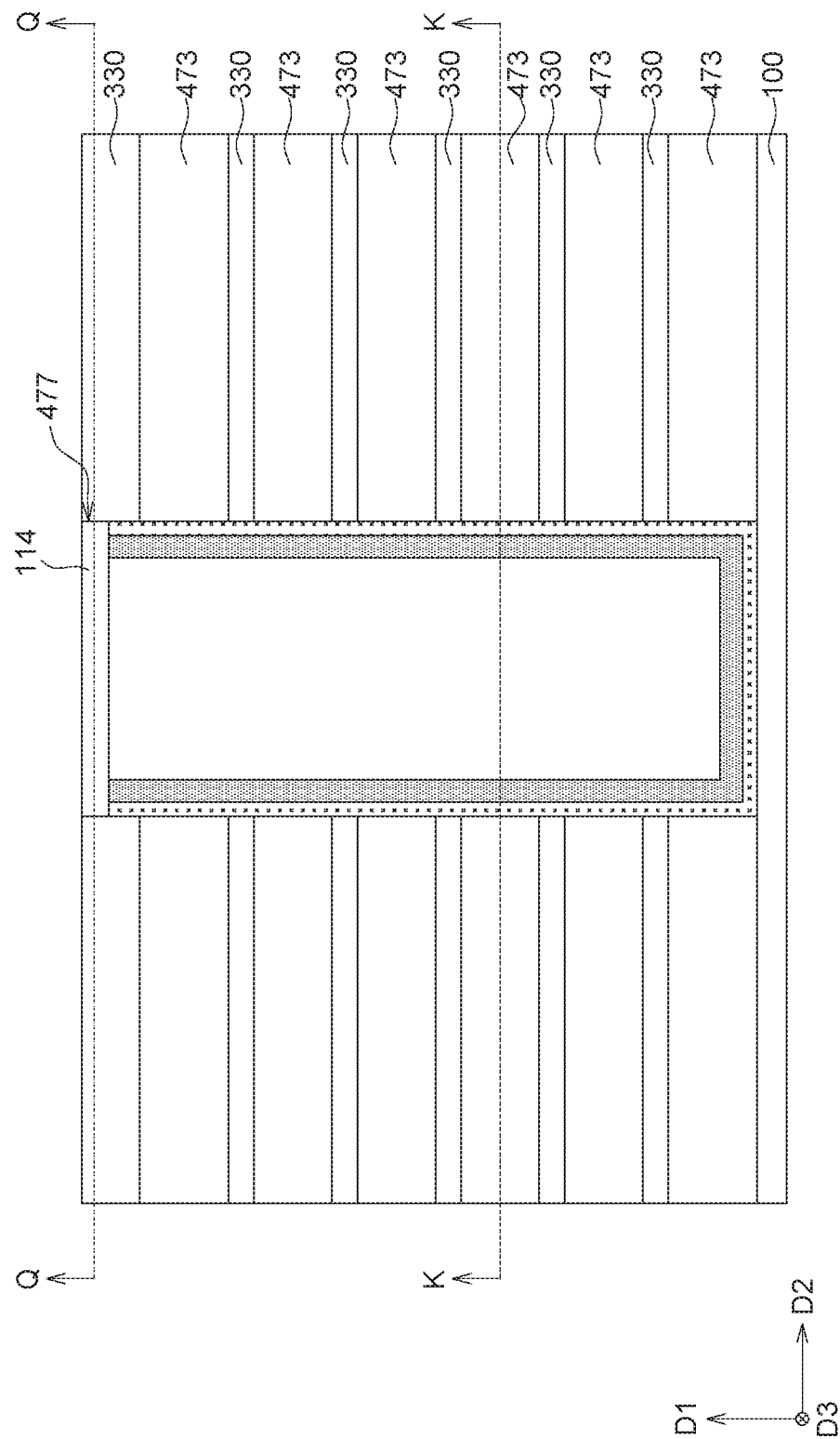

Referring to FIG. 5, the conductive layer 114 may be formed to fill the recess 477. In an embodiment, the conductive layer 114 may be formed by a method comprising forming a conductive material filling the recess 477 and on the upper surface of the stack structure, and removing a portion of the conductive material on the upper surface of the stack structure by a CMP method or other suitable etching methods. The conductive material may comprise a doped polysilicon, such as a heavily doped N-type polysilicon, or other suitable conductive materials such as a metal and so on. In an embodiment, the sacrificial layer 474 and the conductive layer 114 on the dielectric layer 330 of the top layer of the stack structure may be removed by a CMP method or other suitable etching methods such as an etch back process to planarize the upper surface of the stack structure.

Figure 5A:
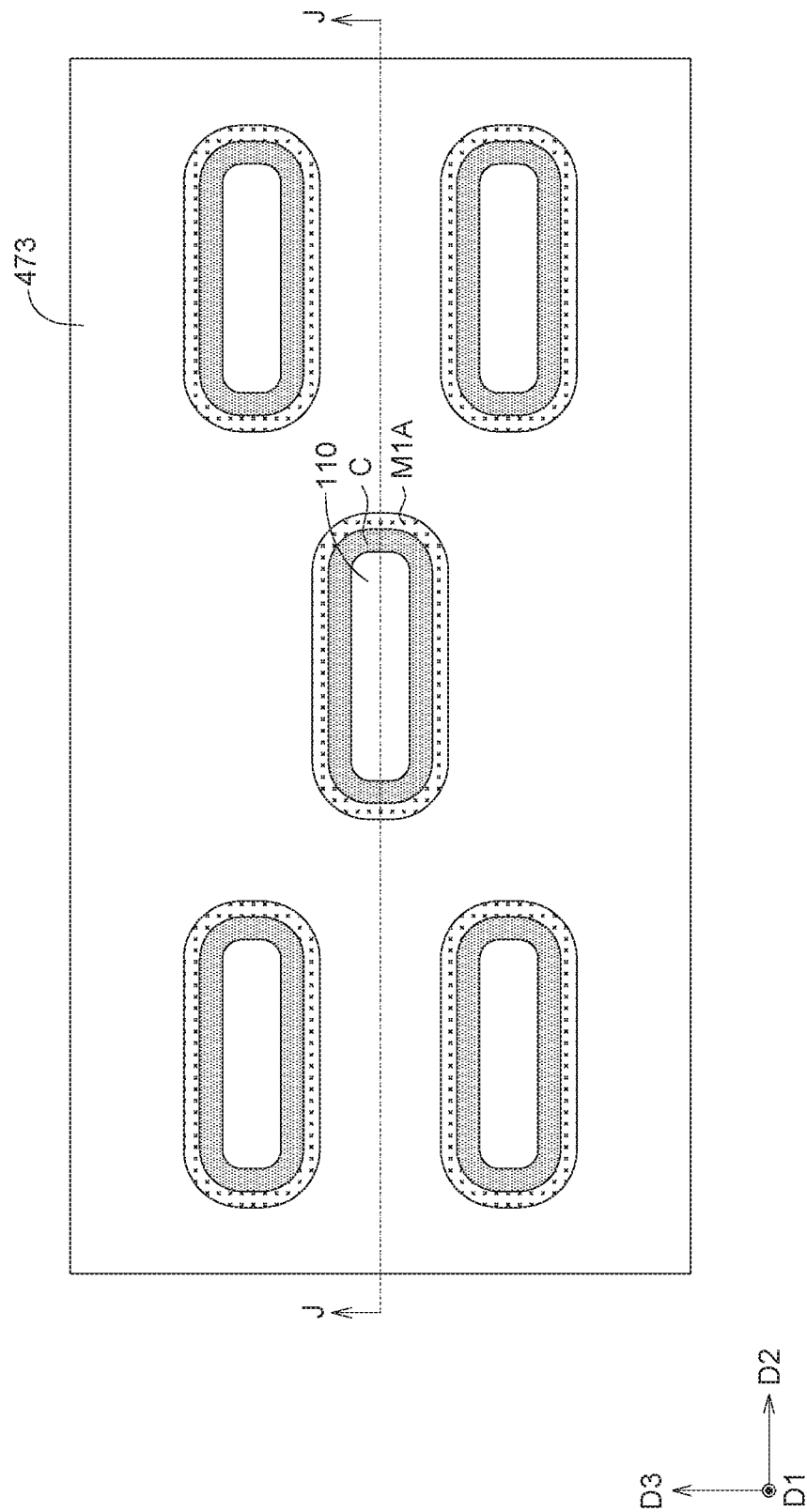
Figure 5B:
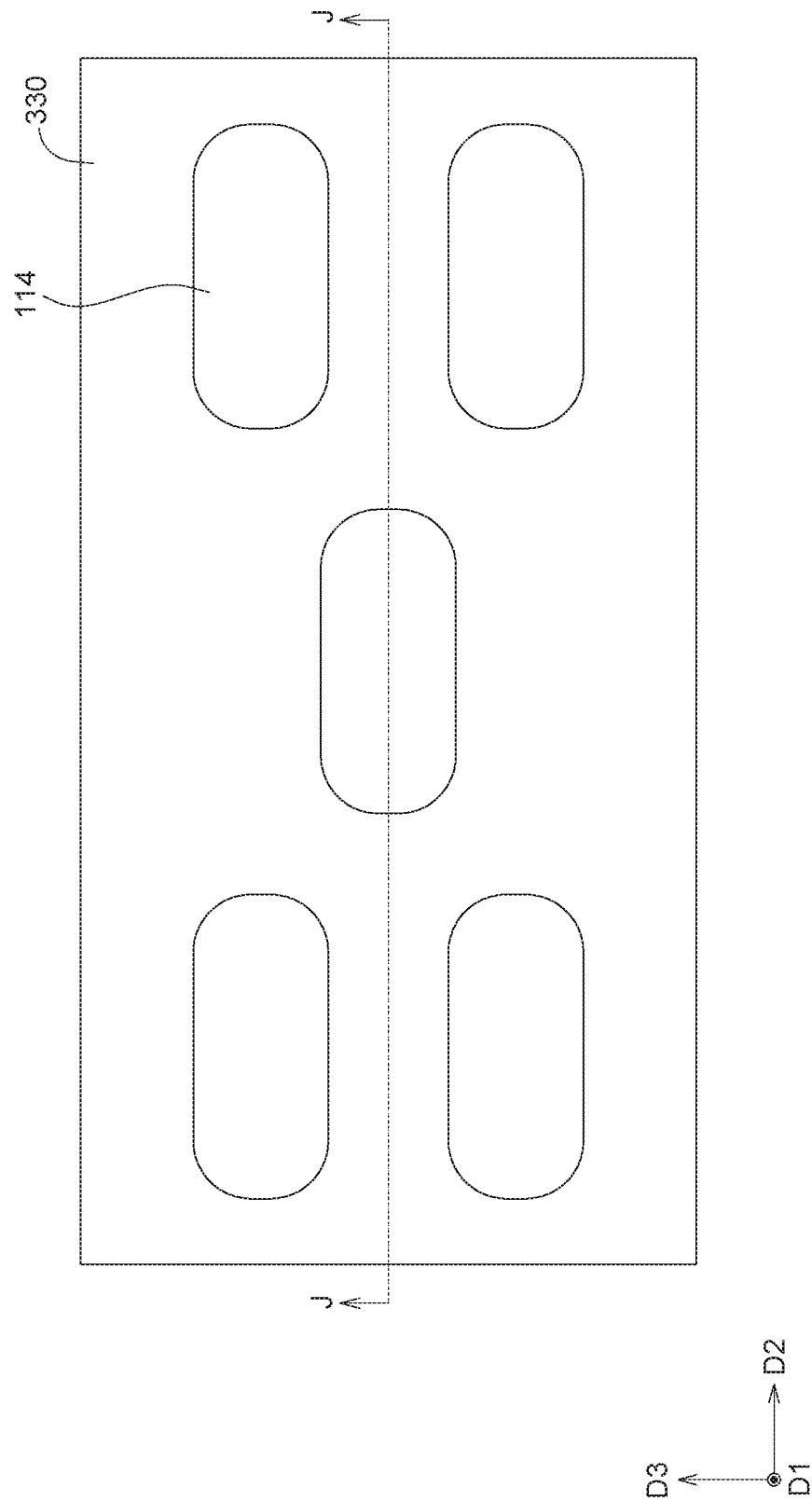

FIG. 5A illustrates a lateral cross-section view of the memory device drawn along a KK cross-section line of FIG. 5. Referring to FIG. 5A, in an embodiment, the dielectric pillar 110 in the opening 475 may have an ellipse shape or a playground shape. The channel element C has a ring shape and surrounds around the dielectric pillar 110. The first memory layer M1A has a ring shape, and surrounds around the channel element C. FIG. 5B illustrates a lateral cross-section view of the memory device drawn along a QQ cross-section line of FIG. 5. Referring to FIG. 5B, the conductive layer 114 may have an ellipse shape or a playground shape. FIG. 5 is a longitudinal cross-section view of the memory device drawn along a JJ cross-section line of FIG. 5A and FIG. 5B.

Figure 6:
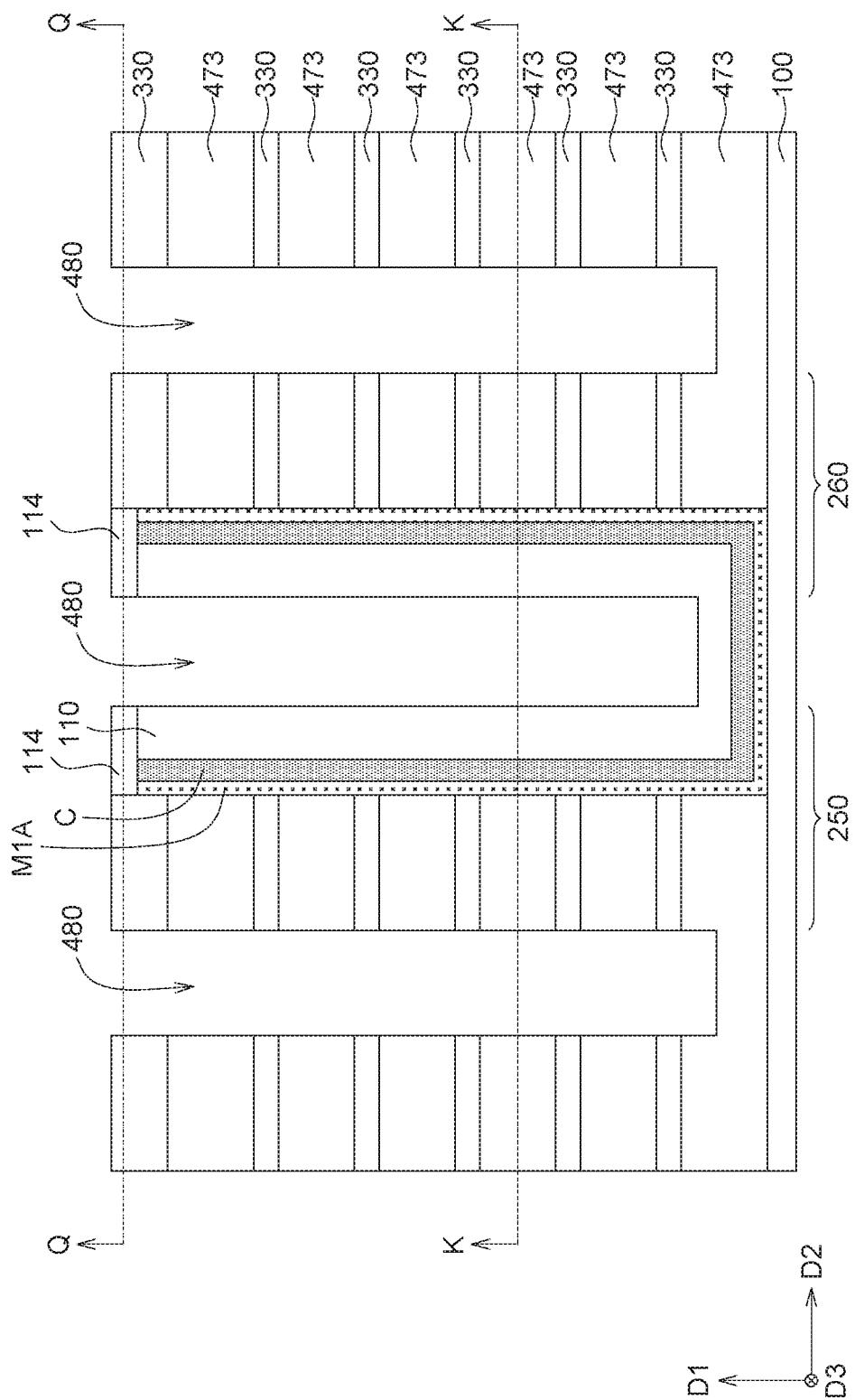

Referring to FIG. 6, a trench 480 may be formed. The trench 480 may be formed by patterning the conductive layer 114 and the stack structure, and upper portions of the dielectric pillar 110, the channel element C, and the first memory layer M1A with using photolithography and etch techniques. The trench 480 may expose the sidewall surface of the dielectric pillar 110, the second sidewall channel surface CS2 of the channel element C, the sidewall surface M1S1 of the first memory layer M1A, the sidewall surface of the sacrificial layers 473, the sidewall surface of the dielectric layer 330, and the sidewall surface of the conductive layer 114. A bottom portion of the trench 480 may expose the dielectric pillar 110, the channel element C and the first memory layer M1A, and the sacrificial layers 473 of the stack structure. The stack regions (e.g. the first stack region 250, the second stack region 260, etc.) are defined through the (trench 480 in the stack structure. The sacrificial layers 473 in the different stack regions are separated from each other.

Figure 6A:
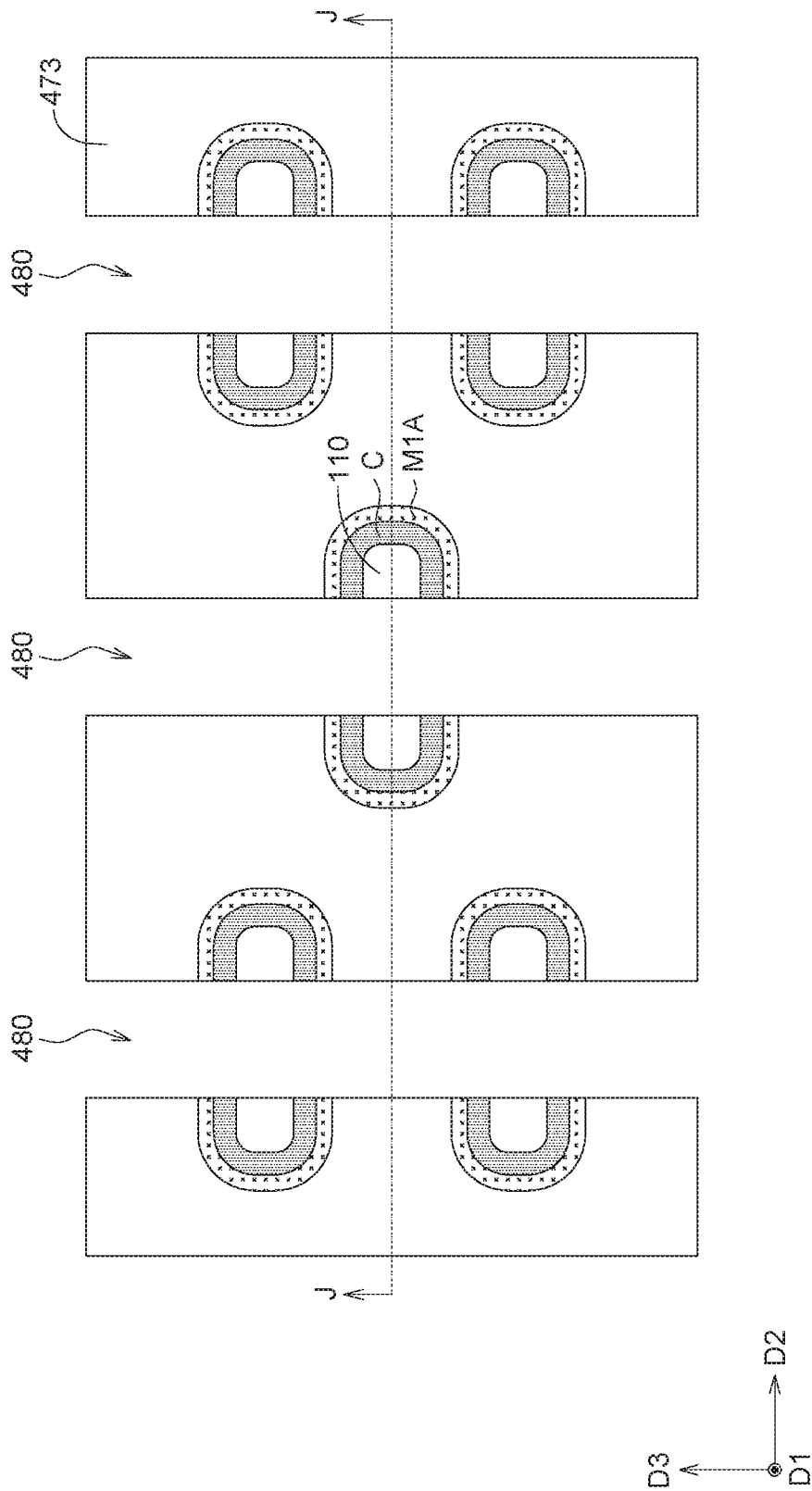
Figure 6B:
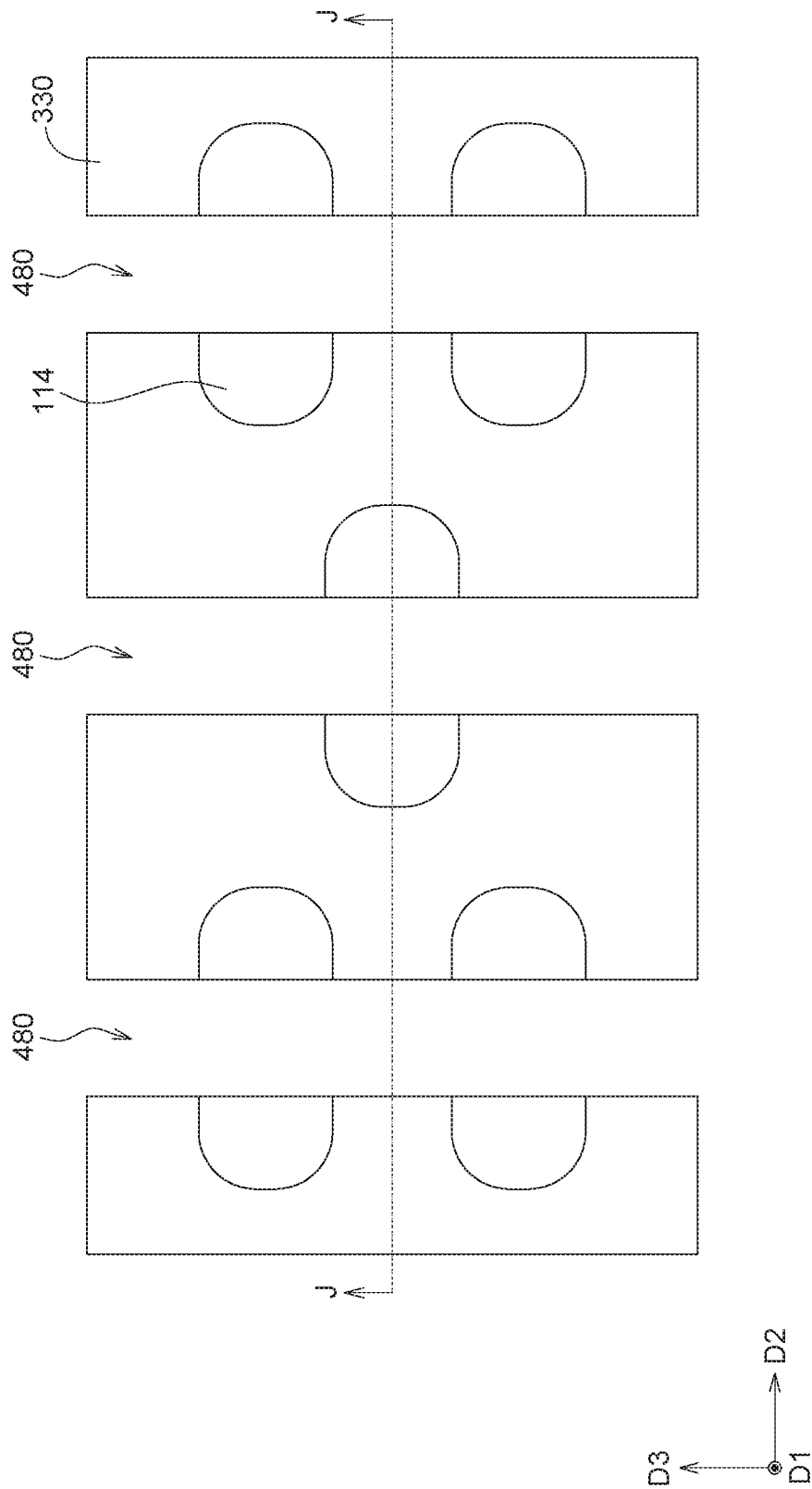

FIG. 6A illustrates a lateral cross-section view of the memory device drawn along a KK cross-section line of FIG. 6. Referring to FIG. 6A, the trench 480 is extended along a third direction D3. The patterned dielectric pillar 110 has a semi-spherical shape. The patterned channel element C may have a U shape, a horseshoe shape, or an open ring shape. The patterned first memory layer MIA may have a U shape, a horseshoe shape, or an open ring shape. FIG. 6B illustrates a lateral cross-section view of the memory device drawn along a QQ cross-section line of FIG. 6. Referring to FIG. 6B, the patterned conductive layer 114 may have a semi-spherical shape. FIG. 6 is a longitudinal cross-section view of the memory device drawn along a JJ cross-section line of FIG. 6A and FIG. 6B.

Figure 7:
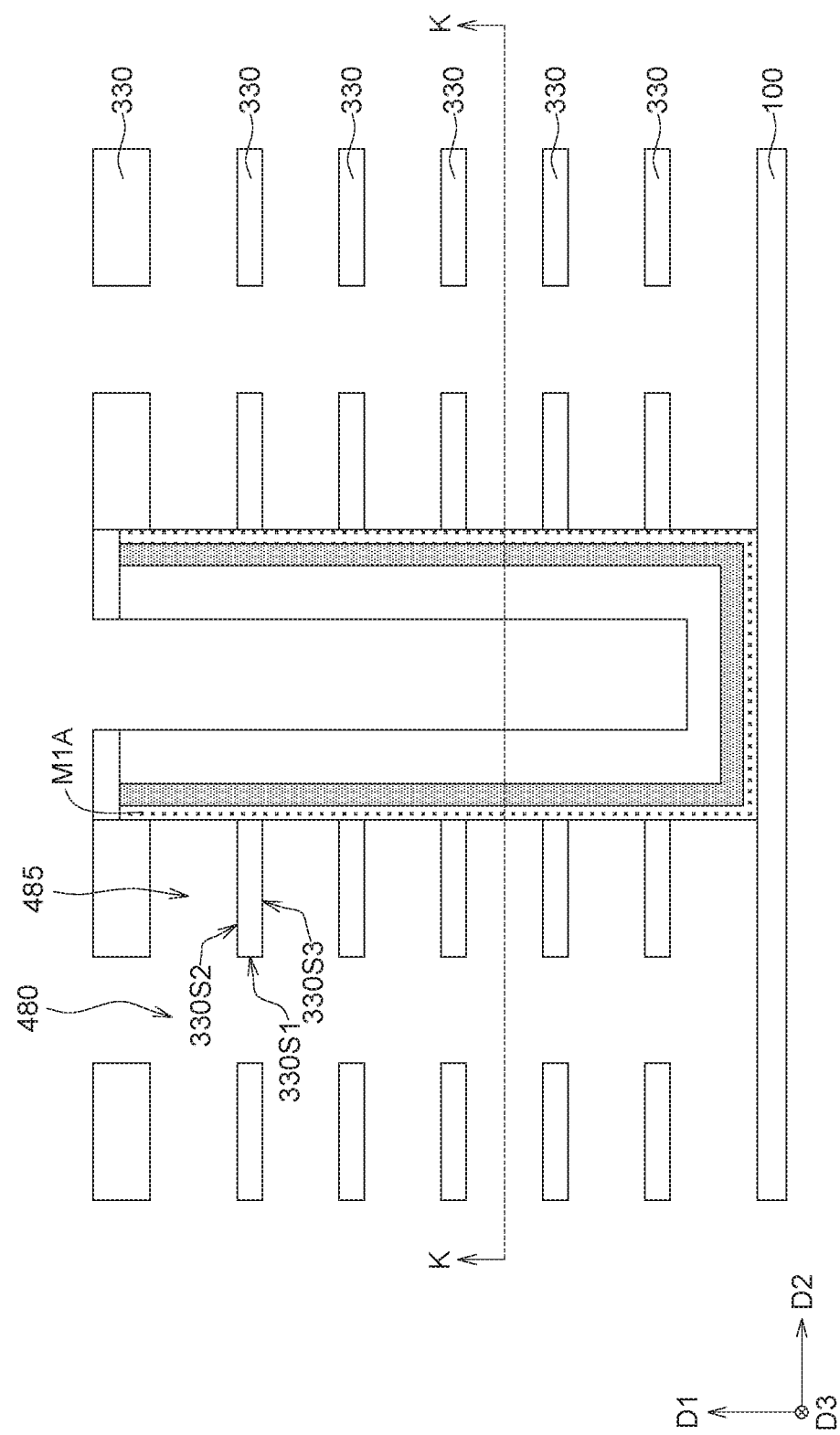

Referring to FIG. 7, the sacrificial layers 473 (FIG. 6) exposed by the trench 480 may be removed to form slits 485. The sacrificial layers 473 may be removed by using an etching method having an etching selectivity. The slits 485 communicate with the trenches 480. The slits 485 may expose the sidewall surface of the first memory layer M1A, the upper surface 330S2 and the lower surface 330S3 of the dielectric layers 330, and the upper surface of the substrate 100.

Figure 7A:
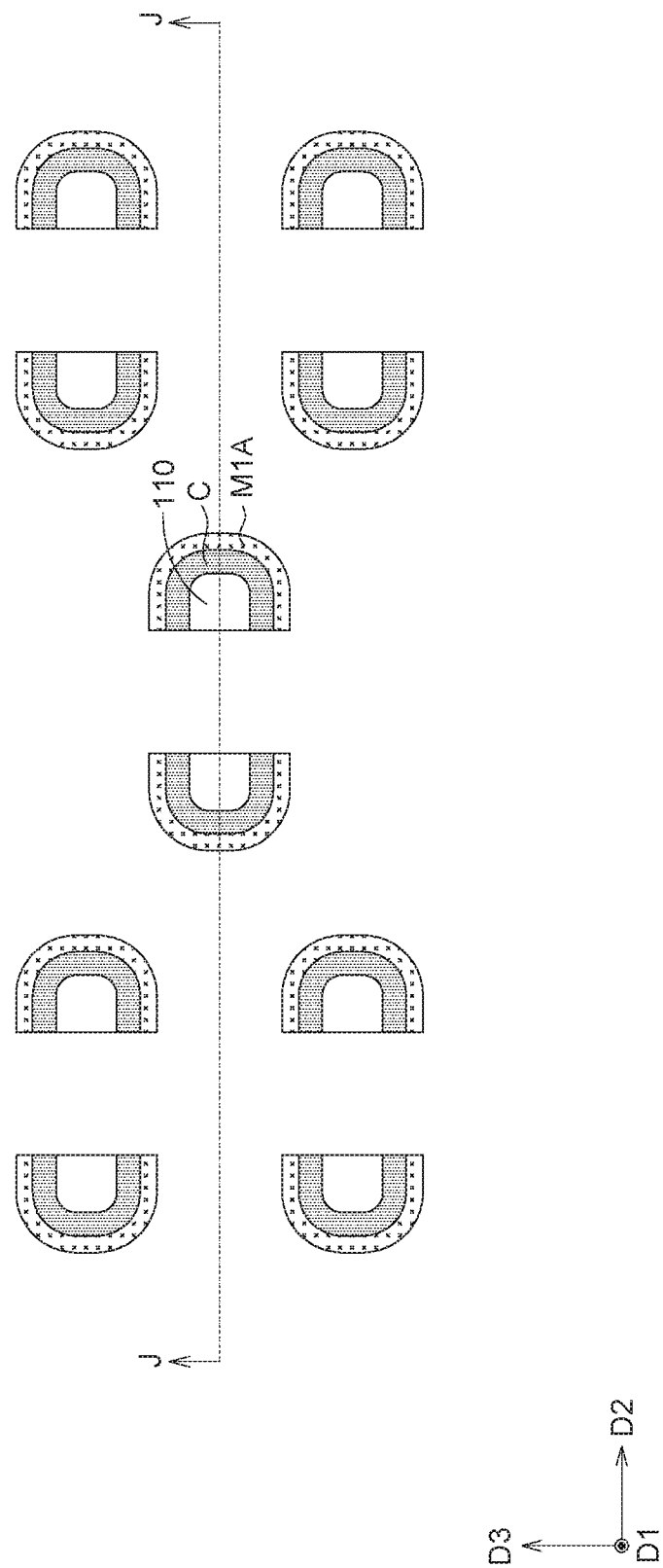

FIG. 7A illustrates a lateral cross-section view of the memory device drawn along a KK cross-section line of FIG. 7. Referring to FIG. 7A, in the step, the dielectric pillar 110, the channel element C and the first memory layer M1A may function as a support body supporting other elements of the memory device, such as the dielectric layers 330, etc. FIG.

7 is a longitudinal cross-section view of the memory device drawn along a JJ cross-section line of FIG. 7A.

Figure 8:
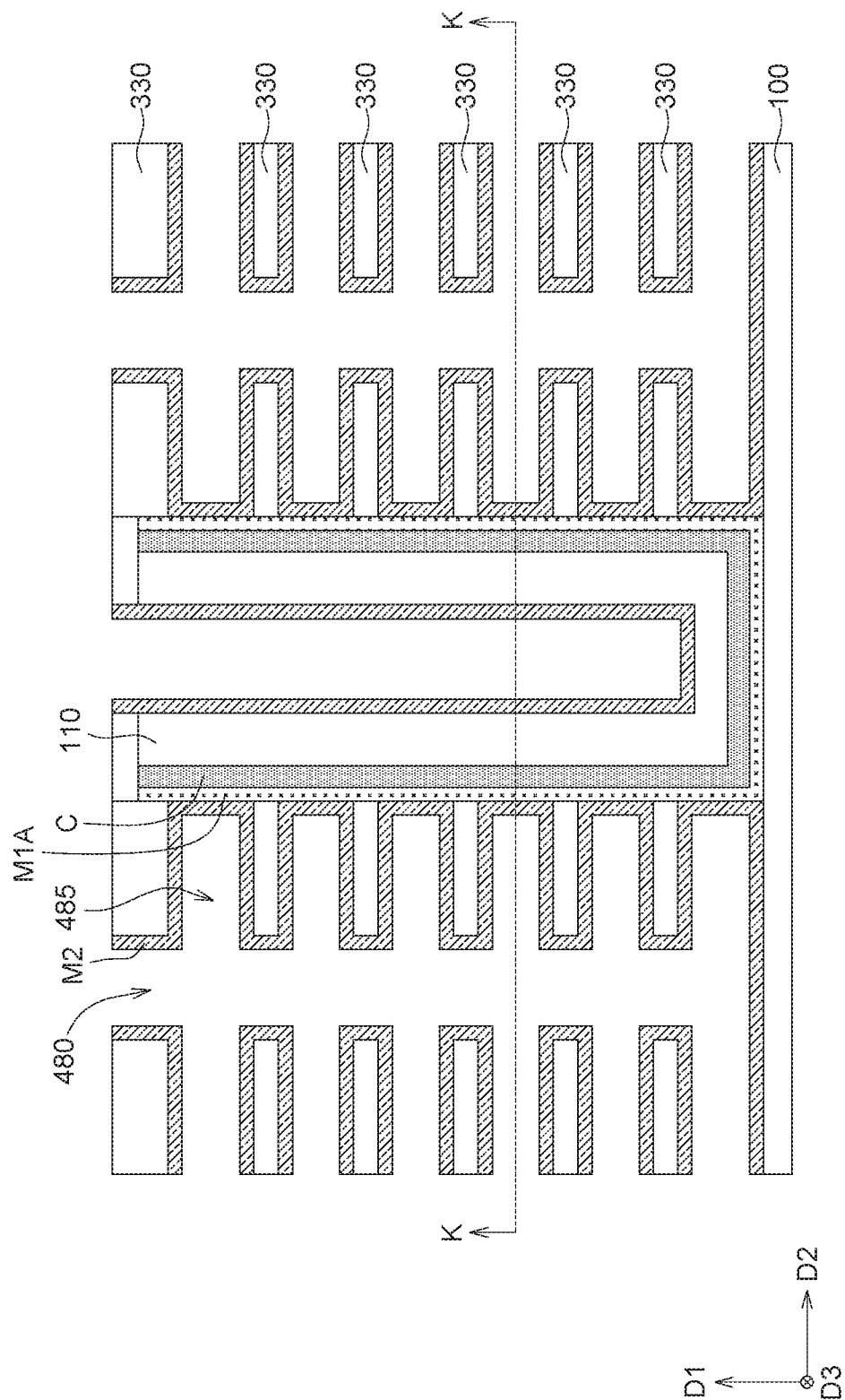

Referring to FIG. 8, the second memory layer M2 may be formed on the dielectric pillar 110, the channel element C, the first memory layer M1A, the dielectric layers 330, and the substrate 100 exposed by the trenches 480 and the slits 485.

Figure 9:
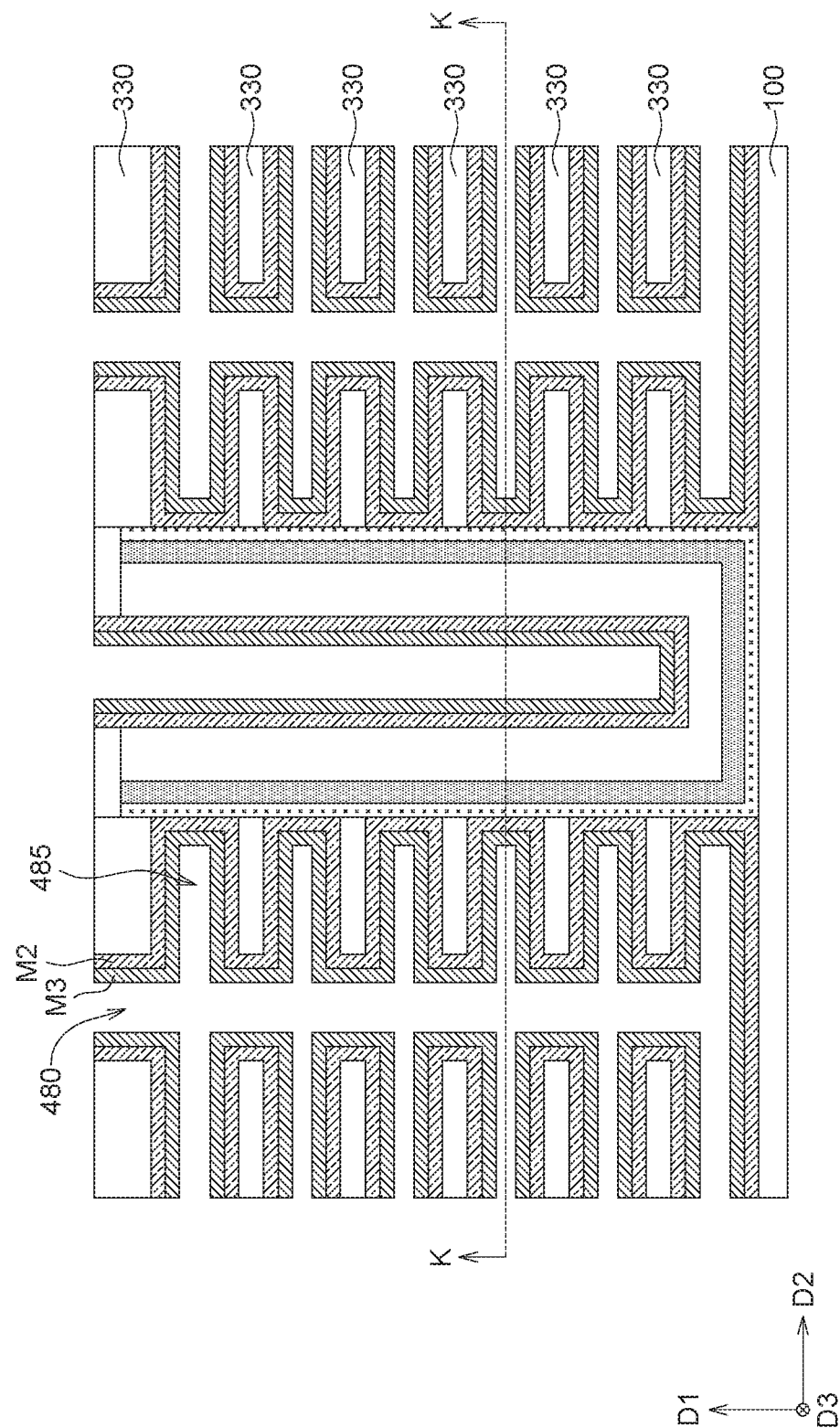

Referring to FIG. 9, the third memory layer M3 may be formed on the second memory layer M2 exposed by the trenches 480 and the slits 485.

Figure 9A:
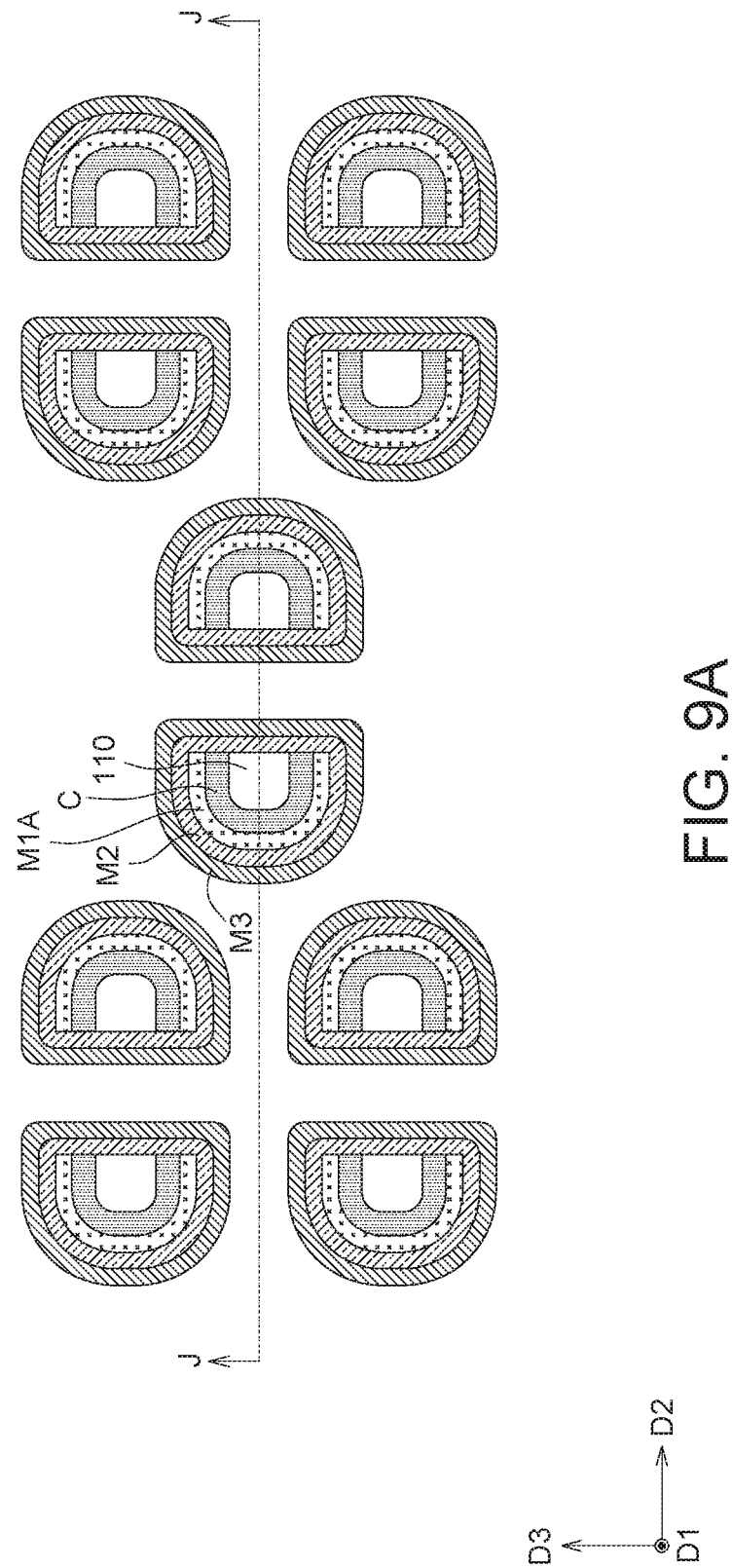

FIG. 9A illustrates a lateral cross-section view of the memory device drawn along a KK cross-section line of FIG. 9. Referring to FIG. 9A, the second memory layer M2 may have a ring shape, and surrounds around the dielectric pillar 110, the channel element C and the first memory layer MIA. The third memory layer M3 may have a ring shape, and surrounds around the second memory layer M2. FIG. 9 is a longitudinal cross-section view of the memory device drawn along a JJ cross-section line of FIG. 9A.

Figure 10:
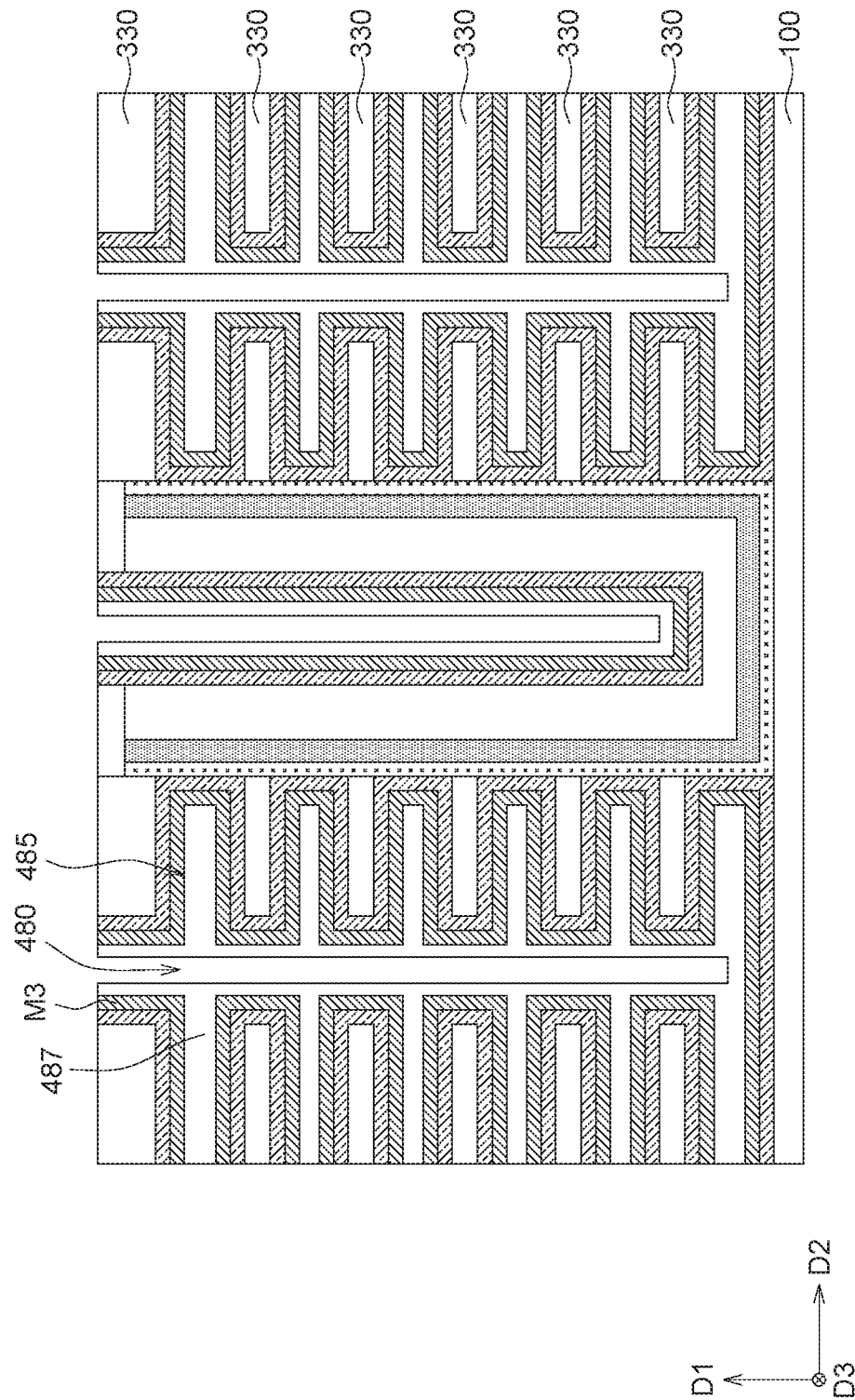

Referring to FIG. 10, an electrode material 487 may be formed on the third memory layer M3 exposed by the trenches 480 and the slits 485. The slits 485 may be filled with the electrode material 487. In an embodiment, the electrode material 487 may comprise a barrier metal such as TiN, etc., and a fill metal such as W formed on the barrier metal. The present disclosure is not limited thereto. The electrode material 487 may comprise other suitable conductive material/arrangements, such as polysilicon, other metals and so on.

Figure 11:
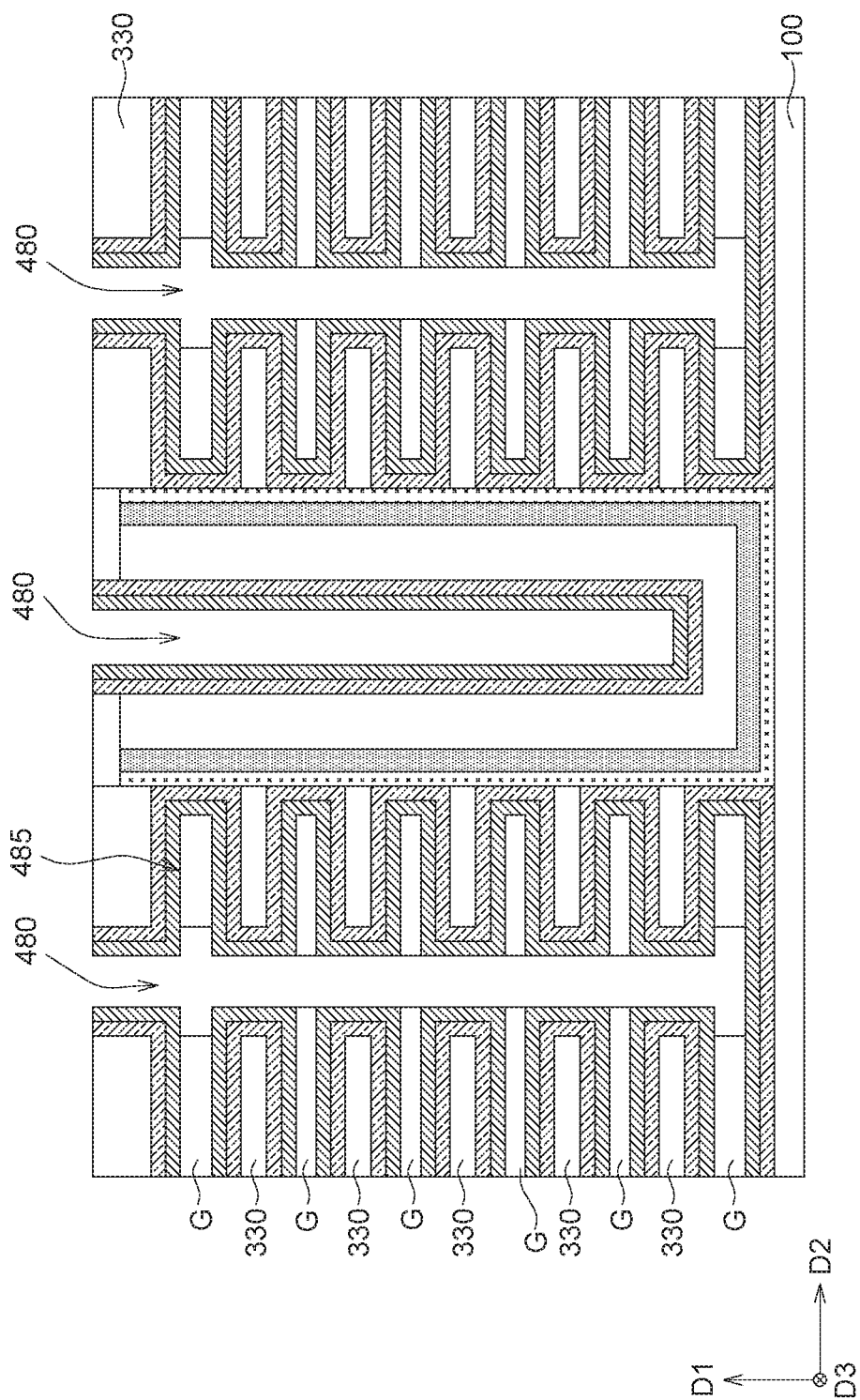

Referring to FIG. 11, an etching back process may be performed to the electrode material 487 (FIG. 10) to remove a portion of the electrode material 487 in the trenches 480, and remain a portion of the electrode material 487 in the slits 485 so as to form the gate electrode layers G. The gate electrode layers G of different layers may be spaced apart from each other and electrically isolated from each other through the dielectric layers 330.

Figure 12:
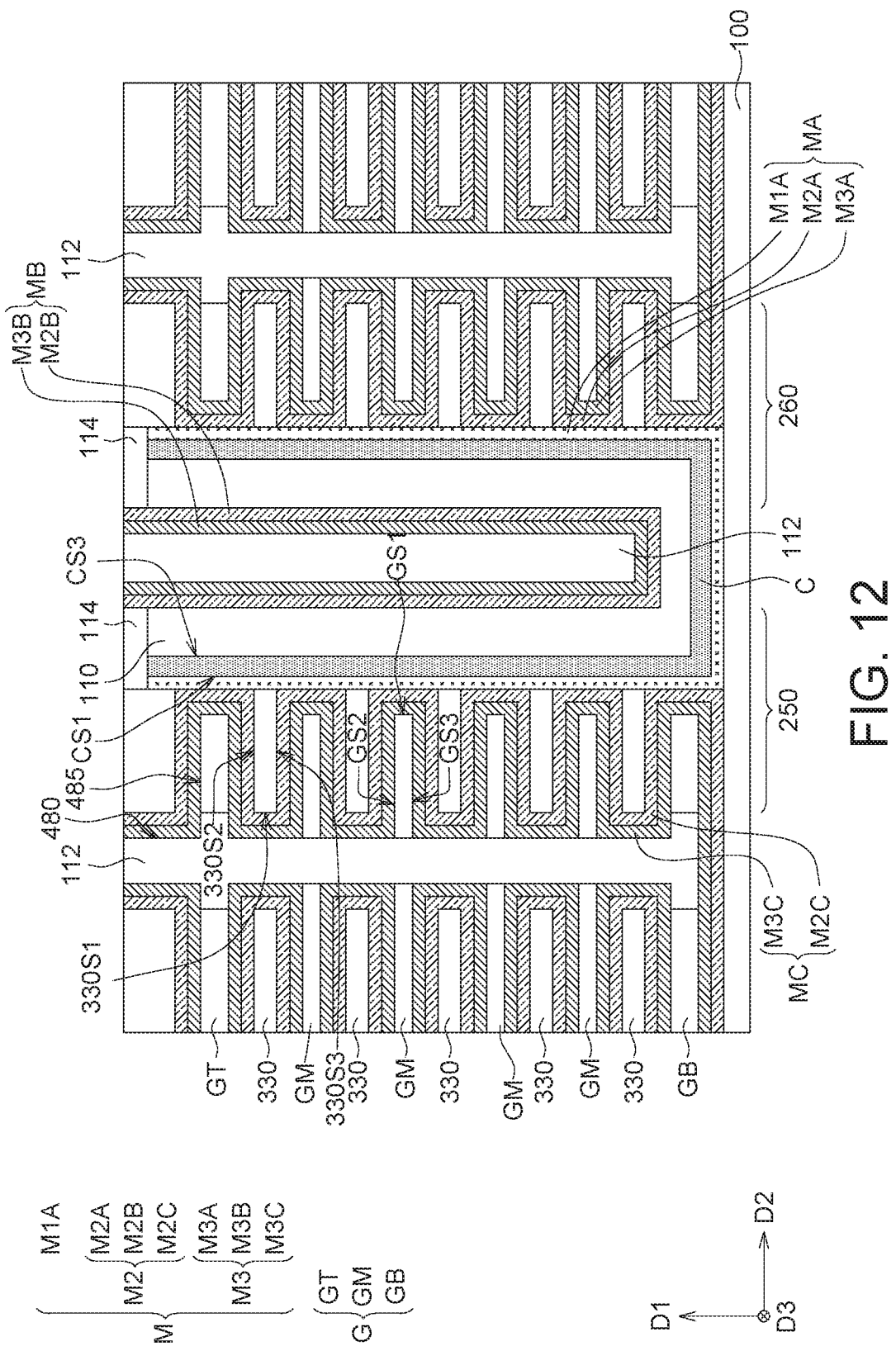

Referring to FIG. 12, the dielectric strip 112 may be formed to fill the trench 480. The slit 485 may be also filled with the dielectric strip 112. The dielectric strip 112 may comprise an oxide such as silicon oxide. The present disclosure is not limited thereto.

Figure 13:
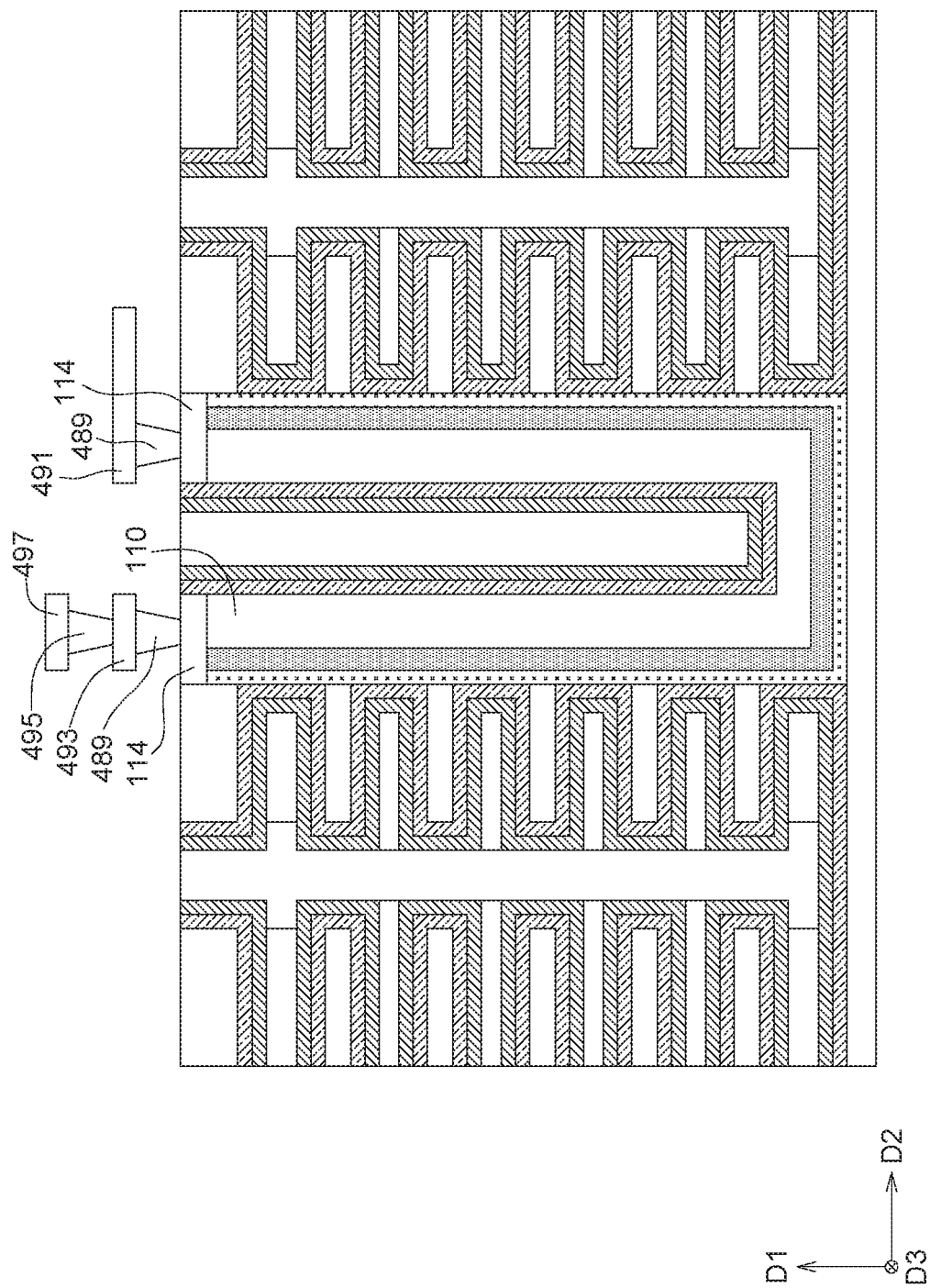

Referring to FIG. 13, a conductive pillar 489 may be formed on the conductive layer 114. A conductive strip 491 and a conductive block 493 may be formed on the conductive pillars 489. A conductive pillar 495 may be formed on the conductive block 493. A conductive strip 497 may be formed on the conductive pillar 495. In an embodiment, the conductive strip 497 may be extended along the second direction D2. The conductive strip 491 may be extended along the third direction D3. In an embodiment, the conductive strip 491 may be functioned as common source line. The conductive strip 497 may be functioned as bit line. The U shape channel element C may be electrically connected between the conductive strip 491 and the conductive strip 497. The first direction D1, the second direction D2 and the third direction D3 may be different from each other, for example, substantially perpendicular to each other. The first direction D1 may be Z direction. The second direction D2 may be X direction. The third direction D3 may be Y direction.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
    a dielectric strip;
    a channel element having a U shape and being mirror-symmetric with respect to the dielectric strip;
    a gate electrode layer electrically coupled to the channel element; and
    a memory element surrounding a sidewall channel surface of the channel element, and being between the dielectric strip and the channel element, wherein a memory cell is defined in the memory element between the channel element and the gate electrode layer.

2. The memory device according to claim 1, wherein the sidewall channel surface of the channel element comprises a first sidewall channel surface, a second sidewall channel surface and a third sidewall channel surface, the second sidewall channel surface is between the first sidewall channel surface and the third sidewall channel surface, the first sidewall channel surface and the third sidewall channel surface have a U shape, wherein the memory element comprises:
    a first memory portion on the first sidewall channel surface; and
    a second memory portion on the second sidewall channel surface.

3. The memory device according to claim 2, wherein the first memory portion has a U shape, the second memory portion has a straightness shape.

4. The memory device according to claim 2, wherein a memory layer amount of the first memory portion is different from a memory layer amount of the second memory portion.

5. The memory device according to claim 2, wherein a memory layer amount of the first memory portion is more a memory layer amount of the second memory portion.

6. The memory device according to claim 1, wherein the memory element comprises:
    a first memory layer;
    a second memory layer on a sidewall surface of the first memory layer; and
    a third memory layer on a sidewall surface of the second memory layer,
    wherein the memory element comprises:
    a first memory portion comprising the first memory layer, the second memory layer and the third memory layer; and
    a second memory portion adjacent to the first memory portion and comprising the second memory layer and the third memory layer.

7. The memory device according to claim 6, wherein first memory portion is between the second memory portion and the gate electrode layer.

8. The memory device according to claim 6, wherein the first memory layer, the second memory layer and the third memory layer of the first memory portion have a U shape, the second memory layer and the third memory layer of the second memory portion have a straightness shape.

9. The memory device according to claim 6, wherein the first memory portion and the channel element are between the second memory portion and the gate electrode layer.

10. The memory device according to claim 6, wherein the first memory layer and the channel element have a coplanar sidewall surface, the second memory portion is on the coplanar sidewall surface.

11. The memory device according to claim 1, wherein the channel element comprises a first sidewall channel surface having a U shape, the memory element comprises:
   a first memory portion on the first sidewall channel surface; and
   a second memory portion having a straightness shape, wherein the first memory portion and the second memory portion form a ring shape.

12. The memory device according to claim 11, further comprising:
   a dielectric pillar, wherein the ring shape formed by the first memory portion and the second memory portion surrounds a sidewall surface of the dielectric pillar,
   wherein the second memory portion is between the dielectric pillar and the dielectric strip.

13. The memory device according to claim 1, comprising a plurality of the gate electrode layers, wherein the memory device further comprises a plurality of dielectric layers, the gate electrode layers and the dielectric layer are arranged along a vertical direction alternately, the memory element is between the plurality of the gate electrode layers and the plurality of the dielectric layers.

14. The memory device according to claim 13, wherein the memory element is on an upper electrode surface and a lower electrode surface of each of the plurality of the gate electrode layers, and on an upper dielectric surface and a lower dielectric surface of each of the plurality of the dielectric layers.

15. The memory device according to claim 13, wherein the memory element is on a sidewall electrode surface of each of the plurality of the gate electrode layers, and on a sidewall dielectric surface of each of the plurality of the dielectric layers, the sidewall electrode surfaces are opposing to the sidewall dielectric surfaces.

16. The memory device according to claim 13, wherein the channel element comprises a first sidewall channel surface having a U shape, the memory element comprises:
   a first memory portion on the first sidewall channel surface; and
   a third memory portion connected to the first memory portion and continuously extended to an upper surface, a lower surface and/or a sidewall surface of the plurality of the dielectric layers.

17. The memory device according to claim 13, wherein the sidewall channel surface of the channel element comprises a first sidewall channel surface, a second sidewall channel surface and a third sidewall channel surface, the second sidewall channel surface is between the first sidewall channel surface and the third sidewall channel surface, the first sidewall channel surface and the third sidewall channel surface have a U shape, wherein the memory element comprises:
   a first memory portion on the first sidewall channel surface;
   a second memory portion on the second sidewall channel surface; and
   a third memory portion on an upper surface and/or a lower surface of the dielectric layer and/or the gate electrode layer, wherein the first memory portion is connected between the second memory portion and the third memory portion.

18. The memory device according to claim 1, comprising a first stack region and a second stack region arranged along a lateral direction, wherein each of the first stack region and the second stack region comprises a plurality of the gate electrode layers arranged along a vertical direction and spaced from each other, the memory device comprises a NAND memory string, the NAND memory string comprises a plurality of the memory cells defined in the memory element between the channel element and the plurality of the gate electrode layer in the first stack region and/or the second stack region.

19. The memory device according to claim 18, wherein the channel element comprises a first sidewall channel surface having a U shape, the memory element comprises:
   a first memory portion on the first sidewall channel surface; and
   a third memory portion connected to the first memory portion and continuously extended to an upper surface and/or a lower surface of the plurality of the gate electrode layers.

20. The memory device according to claim 19, wherein a memory layer amount of the first memory portion is different from a memory layer amount of the third memory portion.

* * * * *